United States Patent
Degai et al.

(10) Patent No.: US 12,176,216 B2
(45) Date of Patent: Dec. 24, 2024

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Motomu Degai, Toyama (JP);
Kimihiko Nakatani, Toyama (JP);
Hiroshi Ashihara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 812 days.

(21) Appl. No.: 17/150,095

(22) Filed: Jan. 15, 2021

(65) Prior Publication Data
US 2021/0166948 A1     Jun. 3, 2021

Related U.S. Application Data

(63) Continuation of application No. PCT/JP2018/026672, filed on Jul. 17, 2018.

(51) Int. Cl.
*H01L 21/3105*     (2006.01)
*C23C 16/04*         (2006.01)
(Continued)

(52) U.S. Cl.
CPC .......... *H01L 21/3105* (2013.01); *C23C 16/04* (2013.01); *C23C 16/34* (2013.01);
(Continued)

(58) Field of Classification Search
CPC ........... H01L 21/3105; H01L 21/32051; H01L 21/28562; H01L 21/306; H01L 21/02312;
(Continued)

(56) References Cited

U.S. PATENT DOCUMENTS 9,911,595 B1 *   3/2018   Smith ............... H01L 21/02219
11,417,518 B2 *  8/2022   Waseda ............... C23C 16/4584
(Continued)

FOREIGN PATENT DOCUMENTS

| CN | 107533951 A | 1/2018 |
| JP | 2003-100746 A | 4/2003 |

(Continued)

OTHER PUBLICATIONS

Japanese Office Action issued on Aug. 31, 2021 for Japanese Patent Application No. 2020-530751.
(Continued)

*Primary Examiner* — Dale E Page
*Assistant Examiner* — Quovaunda Jefferson
(74) *Attorney, Agent, or Firm* — Volpe Koenig

(57) ABSTRACT

There is provided a technique that includes: organically terminating a first region of a substrate by supplying an adsorption control agent containing an organic ligand to the substrate while regulating a temperature of the substrate including the first region and a second region different from
(Continued)

the first region formed on a surface of the substrate depending on a composition of the first region; and selectively growing a film on the second region by supplying a deposition gas to the substrate.

8 Claims, 10 Drawing Sheets

(51) Int. Cl.
    *C23C 16/34*     (2006.01)
    *C23C 16/455*    (2006.01)
    *C23C 16/46*     (2006.01)
    *C23C 16/52*     (2006.01)
    *H01L 21/3205*   (2006.01)

(52) U.S. Cl.
    CPC ........ *C23C 16/45563* (2013.01); *C23C 16/46* (2013.01); *C23C 16/52* (2013.01); *H01L 21/32051* (2013.01)

(58) Field of Classification Search
CPC ........... H01L 21/0228; H01L 21/67103; C23C 16/02; C23C 16/04; C23C 16/34; C23C 16/45563; C23C 16/46; C23C 16/52; C23C 16/45553; C23C 16/45534; C23C 16/45544; C23C 14/04
See application file for complete search history.

(56) References Cited

U.S. PATENT DOCUMENTS

| | | | |
|---|---|---|---|
| 2005/0208778 A1* | 9/2005 | Li | H01L 21/0228 |
| | | | 257/E21.546 |
| 2015/0147873 A1 | 5/2015 | Moriya et al. | |
| 2016/0322213 A1 | 11/2016 | Thompson et al. | |
| 2017/0110368 A1* | 4/2017 | Yu | H01L 21/76814 |
| 2017/0342553 A1 | 11/2017 | Yu et al. | |
| 2018/0199432 A1 | 7/2018 | Thompson et al. | |
| 2021/0143001 A1* | 5/2021 | Ashihara | C23C 16/0218 |

FOREIGN PATENT DOCUMENTS

| | | |
|---|---|---|
| JP | 2015-122481 A | 7/2015 |
| JP | 2017-222928 A | 12/2017 |
| JP | 2018-523289 A | 8/2018 |
| KR | 2016-0130165 A | 11/2016 |

OTHER PUBLICATIONS

Korean Office Action issued on Jan. 16, 2023 for Korean Patent Application No. 10-2021-7001405.
PCT/JP2018/026672 International Search Report, Aug. 28, 2018, 2 pgs.
Chinese Office Action issued on Jul. 27, 2023 for Chinese Patent Application No. 201880095678.9.

* cited by examiner (HMDSN)

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

The application is a Bypass Continuation Application of PCT International Application No. PCT/JP2018/026672, filed Jul. 17, 2018, the disclosure of which is incorporated herein in its entirety by reference.

TECHNICAL FIELD

The present disclosure relates to a method of manufacturing a semiconductor device, a substrate processing apparatus, and a recording medium.

BACKGROUND

In the related art, a patterning technique is also becoming miniaturized according to miniaturization of large scale integrated circuits (hereinafter, referred to as "LSIs"). As the patterning technique, for example, a hard mask or the like is used, but it is difficult to apply a method of exposing a resist to separate an etching region and a non-etching region due to the miniaturization of the patterning technique. For this reason, an epitaxial film such as silicon (Si) or silicon germanium (SiGe) is selectively grown and formed on a substrate such as a silicon (Si) wafer.

SUMMARY

Some embodiments of the present disclosure provide a technique capable of selectively forming a film on a substrate.

According to embodiments of the present disclosure, there is provided a technique that includes: organically terminating a first region of a substrate by supplying an adsorption control agent containing an organic ligand to the substrate while regulating a temperature of the substrate including the first region and a second region different from the first region formed on a surface of the substrate depending on a composition of the first region; and selectively growing a film on the second region by supplying a deposition gas to the substrate.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to obscure aspects of the various embodiments.

Exemplary embodiments of the present disclosure will now be described.

Figure 1:
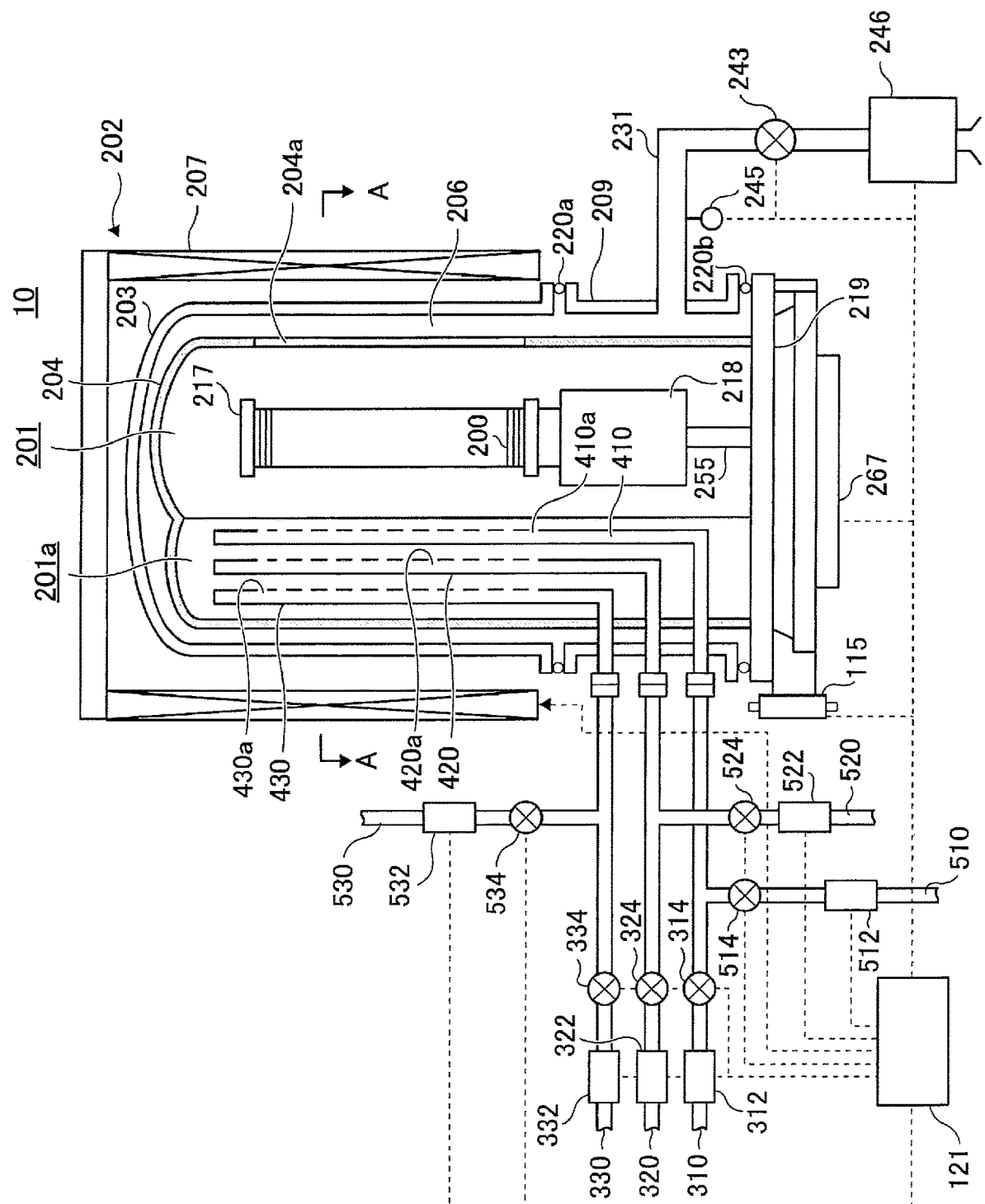
FIG. 1 is a vertical cross-sectional view schematically illustrating a process furnace of a substrate processing apparatus according to embodiments of the present disclosure.

FIG. 1 is a vertical cross-sectional view of a substrate processing apparatus configured to perform a method of manufacturing a semiconductor device (hereinafter, simply referred to as a "substrate processing apparatus 10").

Hereinafter, a description will be made with reference to FIGS. 1 to 4. The substrate processing apparatus 10 is configured as an example of an apparatus used in the processes of manufacturing a semiconductor device. Further, in the following description, a case where a titanium nitride (TiN) film as a thin film is formed on a wafer 200 in which a silicon (Si) layer, a silicon nitride (SiN) layer, and a silicon oxide (SiO$_2$) layer are formed as base films on a surface of the wafer 200 will be described.

(1) Configuration of the Substrate Processing Apparatus

The substrate processing apparatus 10 includes a process furnace 202 in which a heater 207 as a heating means (a heating mechanism or a heating system) is installed. The heater 207 has a cylindrical shape and is supported by a heater base (not shown) as a holding plate to be vertically installed.

An outer tube 203 constituting a reaction vessel (process vessel) is disposed inside the heater 207 to be concentric with the heater 207. The outer tube 203 is made of a heat resistant material, e.g., quartz (SiO$_2$), silicon carbide (SiC) or the like, and has a cylindrical shape with its upper end closed and its lower end opened. A manifold (inlet flange) 209 is disposed below the outer tube 203 in a concentric relationship with the outer tube 203. The manifold 209 is made of metal, e.g., stainless steel (SUS), and has a cylindrical shape with its upper and lower ends opened. An O-ring 220a as a seal member is installed between the upper end portion of the manifold 209 and the outer tube 203. The manifold 209 is supported by the heater base. Thus, the outer tube 203 comes into a vertically mounted state.

An inner tube 204 constituting a reaction vessel is disposed inside the outer tube 203. The inner tube 204 is made of a heat resistant material, e.g., quartz (SiO$_2$), silicon carbide (SiC) or the like, and has a cylindrical shape with its upper end closed and its lower end opened. The process vessel (reaction vessel) mainly includes the outer tube 203, the inner tube 204, and the manifold 209. A process chamber 201 is formed in a hollow cylindrical portion of the process vessel (inside the inner tube 204).

The process chamber 201 is configured to accommodate wafers 200 as substrates, in such a state that the wafers 200 are arranged in a horizontal posture and in multiple stages along a vertical direction in a boat 217 to be described below.

Nozzles 410, 420 and 430 are installed in the process chamber 201 to penetrate a sidewall of the manifold 209 and the inner tube 204. Gas supply pipes 310, 320 and 330 are respectively connected to the nozzles 410, 420 and 430. However, the process furnace 202 of the present embodiment is not limited to the aforementioned configuration.

Mass flow controllers (MFCs) 312, 322, and 332, which are flow rate controllers (flow rate control parts), are installed at the gas supply pipes 310, 320 and 330 sequentially from the corresponding upstream sides, respectively. In addition, valves 314, 324, and 334, which are opening/closing valves, are installed at the gas supply pipes 310, 320 and 330, respectively. Gas supply pipes 510, 520 and 530, which supply an inert gas, are respectively connected to the gas supply pipes 310, 320, and 330 at the downstream side of the valves 314, 324 and 334. MFCs 512, 522 and 532, which are flow rate controllers (flow rate control parts), and valves 514, 524 and 534, which are opening/closing valves, are installed at the gas supply pipes 510, 520 and 530 sequentially from the corresponding upstream sides, respectively.

The nozzles 410, 420, and 430 are connected to front end portions of the gas supply pipes 310, 320, and 330 respectively. The nozzles 410, 420 and 430 are each configured as an L-shaped nozzle. Horizontal portions of the nozzles 410, 420 and 430 are formed to penetrate the sidewall of the manifold 209 and the inner tube 204. Vertical portions of the nozzles 410, 420 and 430 is formed in a channel-shaped (groove-shaped) spare chamber 201a formed to protrude outward of the inner tube 204 in a radial direction and to extend along the vertical direction, and is also formed to extend upward along the inner wall of the inner tube 204 in the spare chamber 201a (upward in the arrangement direction of the wafers 200).

The nozzles 410, 420, and 430 are installed to extend from a lower region of the process chamber 201 to an upper region of the process chamber 201, and a plurality of gas supply holes 410a, 420a and 430a are respectively formed at the opposite positions of the wafers 200. Thus, a processing gas is supplied from each of the gas supply holes 410a, 420a, and 430a of the nozzles 410, 420, and 430 to the wafers 200. The gas supply holes 410a, 420a, and 430a may be installed in a plural number between the lower portion of the inner tube 204 and the upper portion of the inner tube 204. The respective gas supply holes 410a, 420a, and 430a may have the same aperture area and may be formed at the same aperture pitch. However, the gas supply holes 410a, 420a and 430a are not limited to the aforementioned configuration. For example, the aperture area may be gradually enlarged from the lower portion of the inner tube 204 to the upper portion of the inner tube 204. Thus, it is possible to make a flow rate of the gas supplied from the gas supply holes 410a, 420a and 430a more uniform.

The gas supply holes 410a, 420a and 430a of the nozzles 410, 420, and 430 may be formed in a plural number at height positions from the lower portion of the boat 217 to the upper portion of the boat 217 to be described below. Therefore, the processing gas supplied from the gas supply holes 410a, 420a and 430a of the nozzles 410, 420, and 430 into the process chamber 201 is supplied to the whole region of the wafers 200 accommodated from the lower portion of the boat 217 to the upper portion of the boat 217. The nozzles 410, 420, and 430 may be installed to extend from the lower region of the process chamber 201 to the upper region of the process chamber 201 but may be installed to extend up to near the ceiling of the boat 217.

A processing gas, which contains an organic ligand, as a pre-processing gas, is supplied from the gas supply pipe 310 into the process chamber 201 via the MFC 312, the valve 314, and the nozzle 410. As the processing gas containing an organic ligand, a processing gas containing an alkyl group such as dialkylamine or the like and containing alkylamine in the ligand (containing an alkyl ligand) is used, and a hexamethyldisilazane (HMDSN) gas containing a methyl group may be used as an example of the processing gas. The processing gas containing the organic ligand is used as an adsorption control agent (adsorption inhibitor) that controls film formation of a deposition gas to be supplied subsequently.

A precursor gas as the deposition gas, as the processing gas, is supplied from the gas supply pipe 320 into the process chamber 201 via the MFC 322, the valve 324, and the nozzle 420. As the precursor gas, a Cl-containing gas containing chlorine (Cl), which is a precursor molecule not adsorbed to the alkyl ligand and which contains, for example, electrically negative ligands such as halogen or the like, is used, and a titanium tetrachloride (TiCl$_4$) gas may be used as an example of the precursor gas.

A reaction gas reacting with the precursor gas as the deposition gas, as the processing gas, is supplied from the gas supply pipe 330 into the process chamber 201 via the MFC 332, the valve 334, and the nozzle 430. As the reaction gas, for example, a N-containing gas containing nitrogen (N) is used, and an ammonia ($NH_3$) gas may be used as an example of the reaction gas.

An inert gas, for example, a nitrogen ($N_2$) gas, is supplied from the gas supply pipes 510, 520, and 530 into the process chamber 201 via the MFCs 512, 522, and 532, the valves 514, 524, and 534, and the nozzles 410, 420, and 430. An example in which the $N_2$ gas is used as the inert gas will be described below, but in addition to the $N_2$ gas, for example, a rare gas such as an argon (Ar) gas, a helium (He) gas, a neon (Ne) gas, a xenon (Xe) gas or the like may be used as the inert gas.

A processing gas supply system mainly includes the gas supply pipes 310, 320, and 330, the MFCs 312, 322 and 332, the valves 314, 324, and 334, and the nozzles 410, 420, and 430, but only the nozzles 410, 420 and 430 may be regarded as the processing gas supply system. The processing gas supply system may be simply referred to as a gas supply system. When an adsorption control agent is allowed to flow from the gas supply pipe 310, a first gas supply system configured to supply the adsorption control agent containing the organic ligand mainly includes the gas supply pipe 310, the MFC 312, and the valve 314, but the nozzle 410 may be regarded as being included in the first gas supply system. Further, a second gas supply system configured to supply the deposition gas mainly includes the gas supply pipes 320 and 330, the MFCs 322 and 332, the valves 324 and 334, and the nozzles 420 and 430, but only the nozzles 420 and 430 may be regarded as the second gas supply system. In addition, when the precursor gas is allowed to flow from the gas supply pipe 320, a precursor gas supply system mainly includes the gas supply pipe 320, the MFC 322, and the valve 324, but the nozzle 420 may be regarded as being included in the precursor gas supply system. Moreover, when a reaction gas is allowed to flow from the gas supply pipe 330, a reaction gas supply system mainly includes the gas supply pipe 330, the MFC 332, and the valve 334, but the nozzle 430 may be regarded as being included in the reaction gas supply system. When a nitrogen-containing gas as the reaction gas is supplied from the gas supply pipe 330, the reaction gas supply system may be referred to as a nitrogen-containing gas supply system. Further, an inert gas supply system mainly includes the gas supply pipes 510, 520, and 530, the MFCs 512, 522, and 532, and the valves 514, 524, and 534.

In a gas supply method according to the present embodiment, a gas is transferred via the nozzles 410, 420, and 430, which are disposed in the spare chamber 201a in annular longitudinal space defined by the inner wall of the inner tube 204 and end portions of a plurality of wafers 200. Then, the gas is injected from the plurality of gas supply holes 410a, 420a and 430a formed at positions of the nozzles 410, 420, and 430 facing the wafers into the inner tube 204. More specifically, the precursor gas or the like is injected from the gas supply hole 410a of the nozzle 410, the gas supply hole 420a of the nozzle 420, and the gas supply hole 430a of the nozzle 430 in a direction parallel to the surfaces of the wafers 200.

An exhaust hole (exhaust port) 204a is a through-hole formed on the sidewall of the inner tube 204 and at the opposite position of the nozzles 410, 420, and 430, and is, for example, a vertically-elongated slit-shaped through-hole. The gas supplied from the gas supply holes 410a, 420a, and 430a of the nozzles 410, 420, and 430 into the process chamber 201 and flowing on the surfaces of the wafers 200 flows through an exhaust passage 206 as a gap formed between the inner tube 204 and the outer tube 203 via the exhaust hole 204a. Then, the gas flowing through the exhaust passage 206 flows through an exhaust pipe 231 and is discharged to the outside of the process furnace 202.

The exhaust hole 204a is formed at the opposite position of the wafers 200, and the gas supplied from the gas supply holes 410a, 420a, and 430a to a region near the wafers 200 in the process chamber 201 flows in the horizontal direction and then flows through the exhaust passage 206 via the exhaust hole 204a. The exhaust hole 204a is not limited to being configured as the slit-shaped through-hole but may be configured by a plurality of holes.

The exhaust pipe 231 configured to exhaust an internal atmosphere of the process chamber 201 is installed at the manifold 209. A pressure sensor 245 as a pressure detector (pressure detection part) which detects the internal pressure of the process chamber 201, an auto pressure controller (APC) valve 243, and a vacuum pump 246 as a vacuum exhaust device are connected to the exhaust pipe 231 sequentially from the corresponding upstream side. The APC valve 243 is configured so that a vacuum exhaust and a vacuum exhaust stop of the interior of the process chamber 201 can be performed by opening and closing the APC valve 243 while operating the vacuum pump 246 and so that the internal pressure of the process chamber 201 can be regulated by adjusting an opening degree of the APC valve 243 while operating the vacuum pump 246. An exhaust system mainly includes the exhaust hole 204a, the exhaust passage 206, the exhaust pipe 231, the APC valve 243, and the pressure sensor 245. The vacuum pump 246 may be regarded as being included in the exhaust system.

A seal cap 219, which serves as a furnace opening lid configured to be capable of hermetically sealing a lower end opening of the manifold 209, is installed under the manifold 209. The seal cap 219 is configured to make contact with the lower end portion of the manifold 209 from a lower side in the vertical direction. The seal cap 219 is made of metal such as, e.g., stainless steel (SUS) or the like, and is formed in a disc shape. An O-ring 220b, which is a seal member making contact with the lower end portion of the manifold 209, is installed at an upper surface of the seal cap 219. A rotation mechanism 267 configured to rotate the boat 217 which accommodates the wafers 200 is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism vertically installed outside the outer tube 203. The boat elevator 115 is configured to be capable of loading or unloading the boat 217 into or from the process chamber 201 by moving the seal cap 219 up or down. The boat elevator 115 is configured as a transfer device (transfer mechanism) which transfers the boat 217 and the wafers 200 accommodated in the boat 217 into and out of the process chamber 201.

The boat 217 serving as a substrate support is configured to support a plurality of wafers 200, e.g., 25 to 200 wafers, in such a state that the wafers 200 are arranged in a horizontal posture along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages (not shown). With this configuration, it may be difficult for heat generated from the heater 207 to be transferred to the seal cap 219. However, the present embodiment is not limited to the aforementioned configuration. For example, instead of installing the heat insulating plates 218 below the boat 217, a heat insulating tube as a tubular member made of a heat resistant material such as quartz or SiC may be installed under the boat 217.

Figure 2:
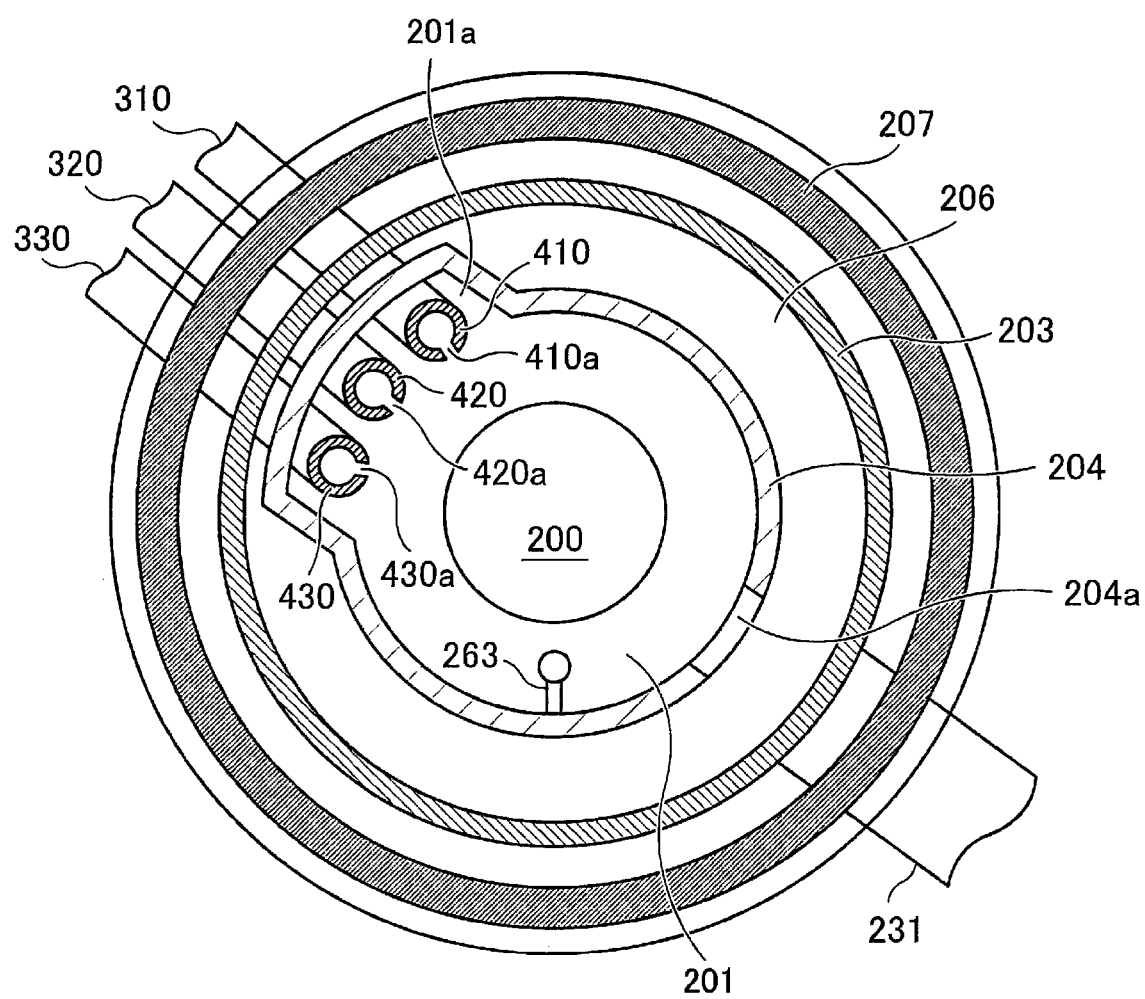
FIG. 2 is a schematic horizontal cross-sectional view of the process furnace taken along a line A-A in FIG. 1.

As illustrated in FIG. 2, a temperature sensor 263 serving as a temperature detector is installed in the inner tube 204. Based on temperature information detected by the temperature sensor 263, an amount of electric power supplied to the heater 207 is regulated such that the interior of the process chamber 201 has a desired temperature distribution. Similar to the nozzles 410, 420, and 430, the temperature sensor 263 is formed in an L shape. The temperature sensor 263 is installed along the inner wall of the inner tube 204.

Figure 3:
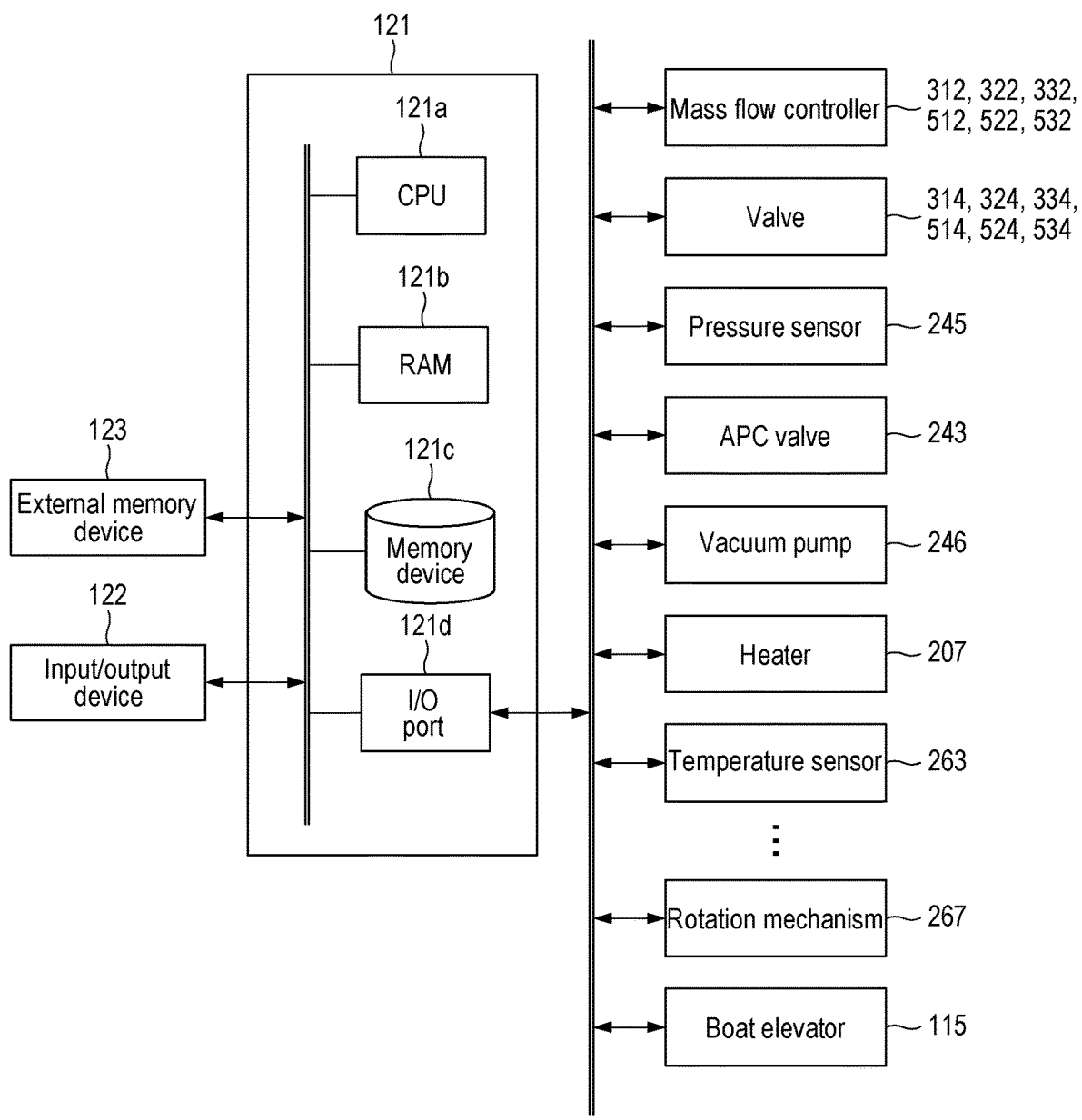
FIG. 3 is a schematic configuration diagram of a controller of a substrate processing apparatus according to embodiments of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to be capable of exchanging data with the CPU 121a via an internal bus. An input/output device 122 formed of, e.g., a touch panel or the like, is connected to the controller 121.

The memory device 121c includes, for example, a flash memory, a hard disk drive (HDD), or the like. A control program that controls operations of a substrate processing apparatus, a process recipe that specifies sequences and conditions of a method of manufacturing a semiconductor device to be described below, and the like are readably stored in the memory device 121c. The process recipe functions as a program configured to cause the controller 121 to execute each process (each step) in the method of manufacturing a semiconductor device, as described below, to obtain a predetermined result. Hereinafter, the process recipe and the control program will be generally and simply referred to as a "program." When the term "program" is used herein, it may indicate a case of including only the process recipe, a case of including only the control program, or a case of including a combination of the process recipe and the control program. The RAM 121b is configured as a memory area (work area) in which a program, data or the like read by the CPU 121a is temporarily stored.

The I/O port 121d is connected to the MFCs 312, 322, 332, 512, 522 and 532, the valves 314, 324, 334, 514, 524 and 534, the pressure sensor 245, the APC valve 243, the vacuum pump 246, the heater 207, the temperature sensor 263, the rotation mechanism 267, the boat elevator 115, and the like.

The CPU 121a is configured to read the control program from the memory device 121c and execute the same. The CPU 121a also reads the recipe and the like from the memory device 121c according to an input of an operation command and the like from the input/output device 122. In addition, the CPU 121a is configured to control, according to the contents of the recipe thus read, flow rate regulating operations of various kinds of gases by the MFCs 312, 322, 332, 512, 522, and 532, opening/closing operations of the valves 314, 324, 334, 514, 524, and 534, opening/closing operations of the APC valve 243, a pressure regulating operation performed by the APC valve 243 based on the pressure sensor 245, a temperature regulating operation performed by the heater 207 based on the temperature sensor 263, driving and stopping of the vacuum pump 246, operations of rotating the boat 217 with the rotation mechanism 267 and adjusting the rotation speed of the boat 217, an operation of moving the boat 217 up or down with the boat elevator 115, an operation of accommodating the wafers 200 in the boat 217, and the like.

The controller 121 may be configured by installing, on the computer, the aforementioned program stored in an external memory device 123 (for example, a magnetic tape, a magnetic disc such as a flexible disc or a hard disk, an optical disc such as a CD or DVD, a magneto-optical disc such as a MO, or a semiconductor memory such as a USB memory or a memory card). The memory device 121c or the external memory device 123 is configured as a computer-readable recording medium. Hereinafter, the memory device 121c and the external memory device 123 will be generally and simply referred to as a "recording medium." In the present disclosure, the term "recording medium" may indicate a case of including only the memory device 121c, a case of including only the external memory device 123, or a case of including both the memory device 121c and the external memory device 123. Further, the program may be supplied to the computer by using a communication means such as the Internet or a dedicated line, instead of using the external memory device 123.

(2) Substrate Processing

Figure 4:
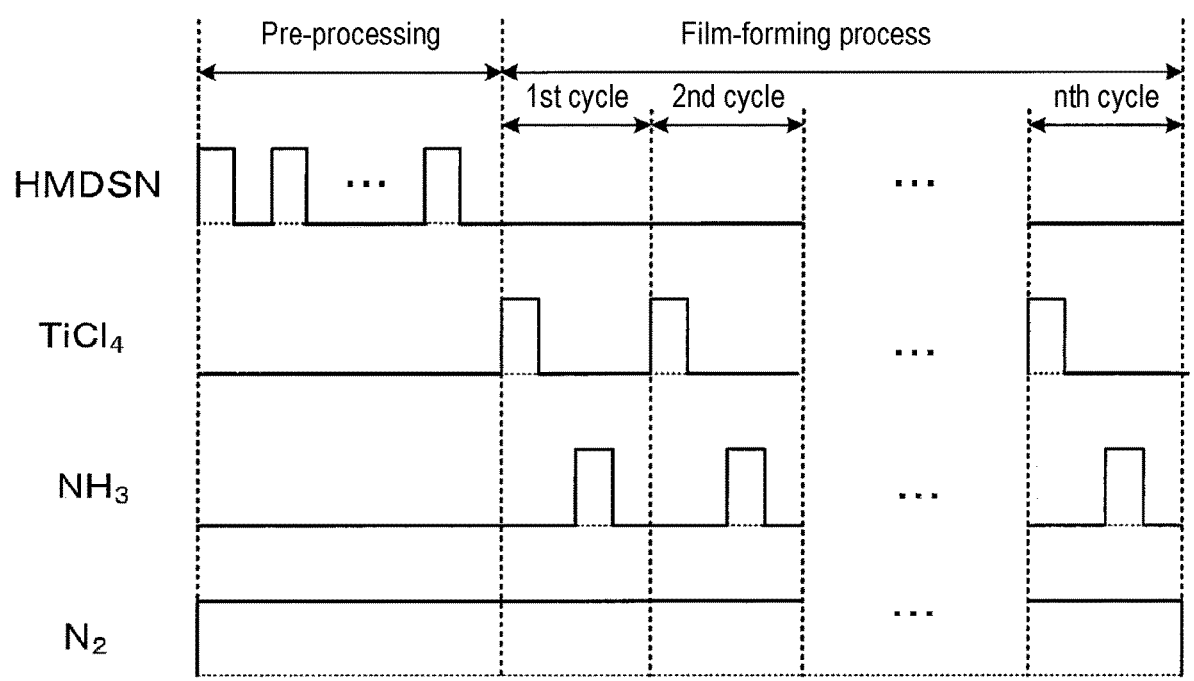
FIG. 4 is a diagram illustrating a gas supply timing according to embodiments of the present disclosure.

An example of selectively growing a TiN film on a SiN layer on a wafer 200 including, for example, a Si layer and a $SiO_2$ layer as a first region and the SiN layer as a second region, which are a plurality of regions as base films, on a surface of the wafer 200, which is a process of manufacturing a semiconductor device, will be described with reference to FIG. 4. This process is performed by using the process furnace 202 of the substrate processing apparatus 10 described above. In the following descriptions, the operations of the respective parts constituting the substrate processing apparatus 10 are controlled by the controller 121.

The substrate processing (the process of manufacturing a semiconductor device) according to the present embodiment includes: a step of organically terminating surfaces of a Si layer and a $SiO_2$ layer by supplying a HMDSN gas as an adsorption control agent containing an organic ligand to a wafer 200 while regulating a temperature of the wafer 200 including the Si layer, a SiN layer, and the $SiO_2$ layer on a surface of the wafer 200 depending on a composition of the Si layer and the $SiO_2$ layer; and a step of selectively growing a TiN film on the SiN layer by supplying a $TiCl_4$ gas as a precursor gas and a $NH_3$ gas as a reaction gas, as deposition gases, to the wafer 200.

Further, the step of organically terminating the surfaces of the Si layer and the $SiO_2$ layer may be performed multiple times. In addition, the step of organically terminating the surfaces of the Si layer and the $SiO_2$ layer will be referred to as "pre-processing." The step of selectively growing the TiN film on the SiN layer will be referred to as a film-forming process.

When the term "wafer" is used herein, it may refer to "a wafer itself" or "a laminated body of a wafer and a predetermined layer or film formed on a surface of the wafer." In addition, when the phrase "a surface of a wafer" is used herein, it may refer to "a surface of a wafer itself" or "a surface of a predetermined layer or film formed on a wafer". Further, when the term "substrate" is used herein, it may be synonymous with the term "wafer."

Wafer Loading

When a plurality of wafers 200 is charged on the boat 217 (wafer charging), as illustrated in FIG. 1, the boat 217 supporting the plurality of wafers 200 is lifted up by the boat elevator 115 and is loaded into the process chamber 201 (boat loading). In this state, the seal cap 219 seals a lower end opening of the outer tube 203 via the O-ring 220.

Pressure Regulation and Temperature Regulation

The interior of the process chamber 201 is vacuum-exhausted by the vacuum pump 246 to reach a desired pressure (degree of vacuum). In this operation, the internal pressure of the process chamber 201 is measured by the pressure sensor 245. The APC valve 243 is feedback-controlled based on the measured pressure information (pressure regulation). The vacuum pump 246 may be continuously activated at least until the processing of the wafers 200 is completed. Further, the interior of the process chamber 201 is heated by the heater 207 to a desired temperature. In this operation, the amount of electric power supplied to the heater 207 is feedback-controlled based on the temperature information detected by the temperature sensor 263 such that the interior of the process chamber 201 has a desired temperature distribution (temperature regulation). The heating of the interior of the process chamber 201 by the heater 207 may be continuously performed at least until the processing of the wafers 200 is completed.

A: Organic Termination Step (Pre-Processing)

First, organic termination is generated on the Si layer and the $SiO_2$ layer of the wafer 200 as pre-processing.

A-1: [Adsorption Control Agent Supply Step]

HMDSN Gas Supply

The valve 314 is opened to allow a HMDSN gas as an adsorption control agent to flow through the gas supply pipe 310. A flow rate of the HMDSN gas is regulated by the MFC 312. The HMDSN gas is supplied from the gas supply hole 410a of the nozzle 410 into the process chamber 201 and is exhausted from the exhaust pipe 231. At this time, the HMDSN gas is supplied to the wafer 200. In parallel with this, the valve 514 is opened to allow an inert gas such as a $N_2$ gas or the like to flow through the gas supply pipe 510. A flow rate of the $N_2$ gas flowing through the gas supply pipe 510 is regulated by the MFC 512. The $N_2$ gas is supplied into the process chamber 201 together with the HMDSN gas and is exhausted from the exhaust pipe 231. At this time, the valves 524 and 534 are opened to allow a $N_2$ gas to flow through the gas supply pipes 520 and 530, thereby preventing the HMDSN gas from entering the nozzles 420 and 430. The $N_2$ gas is supplied into the process chamber 201 via the gas supply pipes 320 and 330 and the nozzles 420 and 430 and is exhausted from the exhaust pipe 231.

At this time, the internal pressure of the process chamber 201 may be set at a pressure which falls within a range of, for example, 10 to 1,000 Pa, by regulating the APC valve 243. A supply flow rate of the HMDSN gas controlled by the MFC 312 may be set at a flow rate which falls within a range of, for example, 10 to 1,000 sccm. The supply flow rates of the $N_2$ gas controlled by the MFCs 512, 522 and 532 may be set at a flow rate which falls within a range of, for example, 20 to 2,000 sccm. At this time, the temperature of the heater 207 is set such that the temperature of the wafer 200 becomes a temperature which falls within a range of, for example, 100 to 250 degrees C., specifically 150 to 250 degrees C. in some embodiments, or specifically 180 to 220 degrees C. in some embodiments. Further, in the present disclosure, an expression of the numerical range such as "100 to 250 degrees C." may mean that a lower limit value and an upper limit value are included in that range. Therefore, "100 to 250 degrees C." may mean "100 degrees C. or higher and 250 degrees C. or lower." The same applies to other numerical ranges.

That is, the temperature of the heater 207 at this time is a temperature at which the organic ligand contained in the HMDSN gas is adsorbed on the Si layer and the $SiO_2$ layer but not adsorbed on the SiN layer such that the surfaces of the Si layer and the $SiO_2$ layer are organically terminated.

The gases flowing through the process chamber 201 at this time are the HMDSN gas and the $N_2$ gas. The organic ligand contained in the HMDSN gas is bonded to and organically terminate the surfaces of the Si layer and the $SiO_2$ layer of the wafer 200 by the supply of the HMDSN gas.

In this case, the temperature at which adsorption, desorption or decomposition of the adsorption control agent starts to occur differs depending on a kind (composition) of the Si layer, the $SiO_2$ layer, the SiN layer or the like on the surface of the wafer. Specifically, the adsorption control agent is more easily adsorbed on the Si layer than on the $SiO_2$ layer and the SiN layer, and the temperature at which the desorption or decomposition of the adsorption control agent starts to occur is high. Further, the adsorption control agent is not adsorbed on the $SiO_2$ layer up to 80 degrees C., but starts being adsorbed on the $SiO_2$ layer from around 100 degrees C. Then, as the temperature rises, an adsorption rate becomes faster, and becomes the fastest around 200 degrees C. However, when the temperature rises to around 250 degrees C., the adsorption control agent begins to be autolyzed. That is, the adsorption control agent may not be adsorbed on either the Si layer or the $SiO_2$ layer at a temperature lower than 100 degrees C., and the adsorption control agent may be autolyzed at a temperature higher than 250 degrees C. such that the organic ligand (the methyl group or the like) may be separated or desorbed from at least the $SiO_2$ layer. In other words, the temperature of the heater 207 is regulated such that the temperature of the wafer 200 becomes, for example, 100 to 250 degrees C., specifically 180 to 220 degrees C. in some embodiments, or specifically 190 to 210 degrees C. in some embodiments, thereby organically terminating the surfaces of the Si layer and the $SiO_2$ layer.

That is, since the kind of the surface of the wafer 200 on which the organic ligand contained in the adsorption control agent is adsorbed may be set different by controlling the temperature of the wafer 200 when the wafer 200 is exposed to the adsorption control agent, film formation may be performed according to the kind of the surface of the wafer. In other words, the kind of the surface of the wafer 200 to be selectively grown may be controlled.

Further, the temperature at which the organic ligand contained in the HMDSN gas is adsorbed on the Si layer to organically terminate the surface of the Si layer is a temperature which falls within a range of 100 to 500 degrees C., specifically 150 to 400 degrees C. in some embodiments, or specifically 180 to 350 degrees C. in some embodiments. In addition, the temperature at which the organic ligand contained in the HMDSN gas is adsorbed on the $SiO_2$ layer to organically terminate the surface of the $SiO_2$ layer is a temperature which falls within a range of 150 to 250 degrees C., specifically 180 to 220 degrees C. in some embodiments, or specifically 190 to 210 degrees C. in some embodiments.

After a predetermined period of time elapses from the start of the supply of the HMDSN gas, the valve 314 of the gas supply pipe 310 is closed to stop the supply of the HMDSN gas.

Figure 5A:
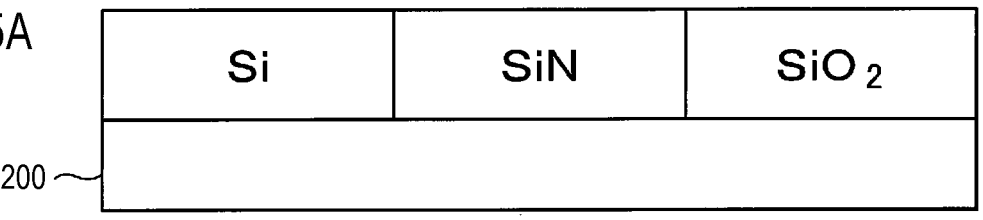
FIG. 5A is a model diagram illustrating a state of a surface of a wafer on which a Si layer, a SiN layer, and a $SiO_2$ layer are formed before exposure to a HMDSN gas.
Figure 5A:
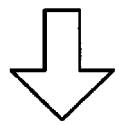
Figure 5A:
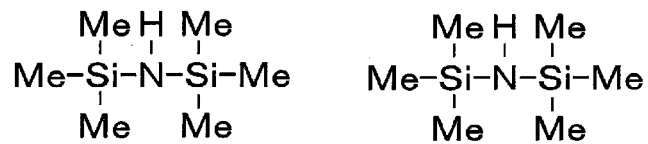
Figure 5A:
Figure 5B:
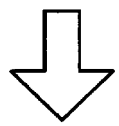
FIG. 5B is a model diagram illustrating a state immediately after the surface of the wafer is exposed to the HMDSN gas.
Figure 5B:
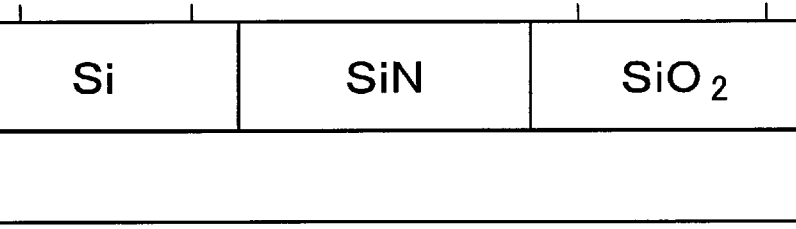
Figure 5B:
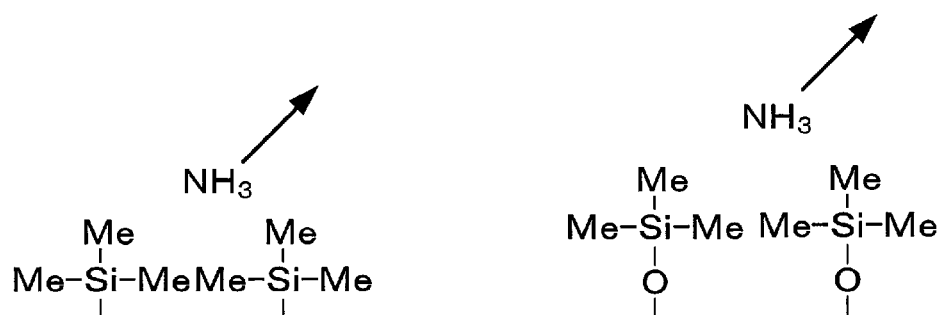
Figure 5C:
FIG. 5C is a model diagram illustrating a state of the surface of the wafer after exposure to the HMDSN gas.

A state in which the surfaces of the Si layer and the SiO$_2$ layer are organically terminated is illustrated in FIGS. 5A to 5C. FIG. 5A is a model diagram illustrating a state of the surface of the wafer 200 on which the Si layer, the SiN layer and the SiO$_2$ layer are formed before exposure to the HMDSN gas, FIG. 5B is a model diagram illustrating a state immediately after the surface of the wafer 200 is exposed to the HMDSN gas, and FIG. 5C is a model diagram illustrating a state of the surface of the wafer 200 after the exposure to the HMDSN gas. In FIGS. 5B and 5C and drawings illustrated subsequently, Me indicates a methyl group (CH$_3$).

Referring to FIGS. 5B and 5C, on the surface of the wafer 200 after exposure to the HMDSN gas, H molecules on the Si layer and the SiO$_2$ layer adsorbed on the surface by the HMDSN gas are bonded to N molecules of the HMDSN gas to generate NH$_3$ to be desorbed. Then, Si(Me)$_3$ containing the methyl group as the organic ligand is adsorbed on a place from which the H molecules are desorbed, to organically terminate the surfaces of the Si layer and the SiO$_2$ layer.

A-2: [Purge Step]

Residual Gas Removal

Next, when the supply of the HMDSN gas is stopped, a purge process is performed to exhaust the gas in the process chamber 201. At this time, the interior of the process chamber 201 is vacuum-exhausted by the vacuum pump 246 while keeping the APC valve 243 of the exhaust pipe 231 opened, and the unreacted HMDSN gas or the HMDSN gas after the surfaces of the Si layer and the SiO$_2$ layer is organically terminated, which remains within the process chamber 201, is removed from the interior of the process chamber 201. At this time, the supply of the N$_2$ gas into the process chamber 201 is maintained while keeping the valves 514, 524 and 534 opened. The N$_2$ gas acts as a purge gas. Thus, it is possible to further remove the unreacted HMDSN gas or the HMDSN gas remaining within the process chamber 201 from the interior of the process chamber 201.

Performing a Predetermined Number of Times

A cycle which sequentially performs the adsorption control agent supply step and the purge step described above is performed once or more (a predetermined number of times (n times)), whereby the surfaces of the Si layer and the SiO$_2$ layer formed on the wafer 200 are organically terminated.

Further, in the pre-processing described above, the supply and exhaust of the HMDSN gas are alternately performed. In a case where a byproduct (for example, HMDSN) generated by reaction between the HMDSN gas and the Si layer and the SiO$_2$ layer as the base films stays on the wafer 200, the Cl-containing gas contained in the precursor gas may be prevented from reaching a surface of the SiN layer of the wafer 200 by such a byproduct. Therefore, the byproduct is exhausted. This prevents an occurrence of harmful effects due to the byproduct.

B. Selective Growth Step (Film-Forming Process)

Subsequently, a TiN film is formed on the surface of the SiN layer on the wafer 200 in which the surfaces of the Si layer and the SiO$_2$ layer are organically terminated by the pre-processing.

B-1: [First Step]

TiCl$_4$ Gas Supply

The valve 324 is opened to allow a TiCl$_4$ gas, which is the precursor gas, to flow through the gas supply pipe 320. The flow rate of the TiCl$_4$ gas is regulated by the MFC 322. The TiCl$_4$ gas is supplied from the gas supply hole 420a of the nozzle 420 into the process chamber 201 and is exhausted from the exhaust pipe 231. At this time, the TiCl$_4$ gas is supplied to the wafer 200. In parallel with this, the valve 524 is opened to allow an inert gas such as a N$_2$ gas or the like to flow through the gas supply pipe 520. The flow rate of the N$_2$ gas flowing through the gas supply pipe 520 is regulated by the MFC 522. The N$_2$ gas is supplied into the process chamber 201 together with the TiCl$_4$ gas and is exhausted from the exhaust pipe 231. At this time, the valves 514 and 534 are opened to allow a N$_2$ gas to flow through the gas supply pipes 510 and 530, thereby preventing the TiCl$_4$ gas from entering the nozzles 410 and 430. The N$_2$ gas is supplied into the process chamber 201 via the gas supply pipes 310 and 330 and the nozzles 410 and 430 and is exhausted from the exhaust pipe 231.

At this time, the internal pressure of the process chamber 201 may be set at a pressure which falls within a range of, for example, 10 to 1,000 Pa, for example, 50 Pa, by regulating the APC valve 243. The supply flow rate of the TiCl$_4$ gas controlled by the MFC 322 may be set at a flow rate which falls within a range of, for example, 0.01 to 1 slm. The supply flow rates of the N$_2$ gas controlled by the MFCs 512, 522 and 532 may be respectively set at a flow rate which falls within a range of, for example, 0.1 to 2 slm. The time, during which the TiCl$_4$ gas is supplied to the wafer 200, may be set at a time which falls within a range of, for example, 0.1 to 100 seconds. At this time, the temperature of the heater 207 is set such that the temperature of the wafer 200 becomes a temperature which falls within a range of, for example, 150 to 500 degrees C., specifically 200 to 400 degrees C. in some embodiments, or specifically 200 to 350 degrees C. in some embodiments.

The gases flowing through the process chamber 201 at this time are the TiCl$_4$ gas and the N$_2$ gas. The TiCl$_4$ gas is not adsorbed on the Si layer and the SiO$_2$ layer whose surfaces are organically terminated in the pre-processing described above, but is adsorbed on the SiN layer. Since halogen (Cl) contained in the TiCl$_4$ gas and the organic ligand on the Si layer and the SiO$_2$ layer are respectively electrically negative ligands, they become repulsive factors which may not be adsorbed easily.

In this case, when a thin film is selectively formed on a specific wafer surface, the precursor gas may be adsorbed on a wafer surface on which a film is not desired to be formed, causing unintended film formation. This is a breaking of selectivity. This breaking of selectivity is likely to occur when probability of adsorption of precursor gas molecules on the wafer is high. That is, lowering the probability of adsorption of precursor gas molecules on the wafer on which the film is not desired to be formed directly leads to improvement of selectivity.

The adsorption of the precursor gas on the wafer surface is brought about when the precursor gas stays on the wafer surface for a certain period of time due to an electrical interaction between the precursor molecules and the wafer surface. That is, the probability of adsorption depends on both an exposure density of the precursor gas or its decomposition product to the wafer and an electrochemical factor of the wafer itself. In the present disclosure, the electrochemical factor of the wafer itself often refers to, for example, surface defects at atomic levels, or electrification by polarization, electric field or the like. That is, if the electrochemical factor and the precursor gas on the wafer surface are easily attracted to each other, it can be said that adsorption is likely to occur.

In a related-art semiconductor film-forming process, a selective film-forming process has been realized by a method of suppressing a precursor gas from staying at a place of the wafer where an adsorption occurs easily as much as possible by lowering a pressure or raising a gas flow velocity of the precursor gas. However, as a surface area of the semiconductor device has increased according to evolution of miniaturization or three-dimensionalization, technical evolution has been achieved such that an exposure amount of the precursor gas to the wafer increases. In recent years, a method of obtaining high step coverage even for a pattern which is fine and large in the surface area by a method which alternately supplies gases has become mainstream. That is, it is difficult to selectively form a film by countermeasures on the precursor gas side.

Further, in semiconductor devices, various thin films such as a Si film or a $SiO_2$ film, a SiN film, and a metal film are used, and particularly, the control of selective growth characteristics in a SiO film, which is one of the most widely used materials, significantly contributes to increasing a margin or a degree of freedom in device processing.

The methyl group as the alkyl ligand contained in the HMDSN gas as the adsorption control agent in the present embodiment is electrically negative. Therefore, in a case where the precursor molecules are negative, the methyl group and the precursor molecules repel each other and may not be easily bonded with each other. For example, since the methyl group (Me—) adsorbed on the Si layer and the $SiO_2$ layer and the halogen (Cl—) contained in the $TiCl_4$ gas are negative, they may not be easily bonded with each other. That is, it can be said that the material containing the alkyl ligand has selective controllability to halogen. Thus, an incubation time is prolonged on the Si layer and the $SiO_2$ layer, thereby selectively growing the TiN film on the surface of the SiN layer other than the Si layer and the $SiO_2$ layer. The incubation time refers to a time until a film begins to grow on the wafer surface.

That is, it is possible to suppress the growth of the thin film on the wafer 200 on which the film is not desired to be formed by supplying the adsorption control agent to the surface of the wafer 200 before supplying the deposition gas thereto. In other words, it is possible to inhibit the surface adsorption of the precursor molecules contained in the precursor gas by adsorbing the adsorption control agent on the surface of the wafer 200.

B-2: [Second Step]

Residual Gas Removal

After the Ti-containing layer is formed, the valve 324 is closed to stop the supply of the $TiCl_4$ gas.

Then, the unreacted $TiCl_4$ gas, the $TiCl_4$ gas contributed to the formation of the Ti-containing layer, or the reaction byproduct, which remains within the process chamber 201, is removed from the interior of the process chamber 201.

B-3: [Third Step]

$NH_3$ Gas Supply

After removing the residual gas within the process chamber 201, the valve 334 is opened to allow a $NH_3$ gas as the reaction gas to flow through the gas supply pipe 330. The flow rate of the $NH_3$ gas is regulated by the MFC 332. The $NH_3$ gas is supplied from the gas supply hole 430a of the nozzle 430 into the process chamber 201 and is exhausted from the exhaust pipe 231. At this time, the $NH_3$ gas is supplied to the wafer 200. In parallel with this, the valve 534 is opened to allow a $N_2$ gas to flow through the gas supply pipe 530. The flow rate of the $N_2$ gas flowing through the gas supply pipe 530 is regulated by the MFC 532. The $N_2$ gas is supplied into the process chamber 201 together with the $NH_3$ gas and is exhausted from the exhaust pipe 231. At this time, the valves 514 and 524 are opened to allow a $N_2$ gas to flow through the gas supply pipes 510 and 520, thereby preventing the $NH_3$ gas from entering the nozzles 410 and 420. The $N_2$ gas is supplied into the process chamber 201 via the gas supply pipes 310 and 320 and the nozzles 410 and 420 and is exhausted from the exhaust pipe 231.

At this time, the internal pressure of the process chamber 201 may be set at a pressure which falls within a range of, for example, 10 to 2,000 Pa, for example, 100 Pa, by regulating the APC valve 243. The supply flow rate of the $NH_3$ gas controlled by the MFC 322 may be set at a flow rate which falls within a range of, for example, 0.1 to 2 slm. The supply flow rates of the $N_2$ gas controlled by the MFCs 512, 522 and 532 may be set at a flow rate which falls within a range of, for example, 0.2 to 3 slm. The time, during which the $NH_3$ gas is supplied to the wafer 200, may be set at a time which falls within a range of, for example, 1 to 120 seconds. The temperature of the heater 207 at this time may be set at the same temperature as that used at the $TiCl_4$ gas supply step.

The gases flowing through the process chamber 201 at this time are only the $NH_3$ gas and the $N_2$ gas. The $NH_3$ gas is substitution-reacted with at least a portion of the Ti-containing layer formed on the SiN layer of the wafer 200 at the first step described above. During the substitution reaction, Ti contained in the Ti-containing layer and N contained in the $NH_3$ gas are bonded to form a TiN film containing Ti and N on the SiN layer on the wafer 200. That is, no TiN film is formed on the Si layer and the $SiO_2$ layer on the wafer 200.

B-4: [Fourth Step]

Residual Gas Removal

After the TiN film is formed, the valve 334 is closed to stop the supply of the $NH_3$ gas.

Then, the unreacted $NH_3$ gas, the $NH_3$ gas contributed to the formation of the TiN film, or the reaction byproduct, which remains within the process chamber 201, is removed from the interior of the process chamber 201 according to the same processing procedures as those of the first step described above.

Figure 6A:
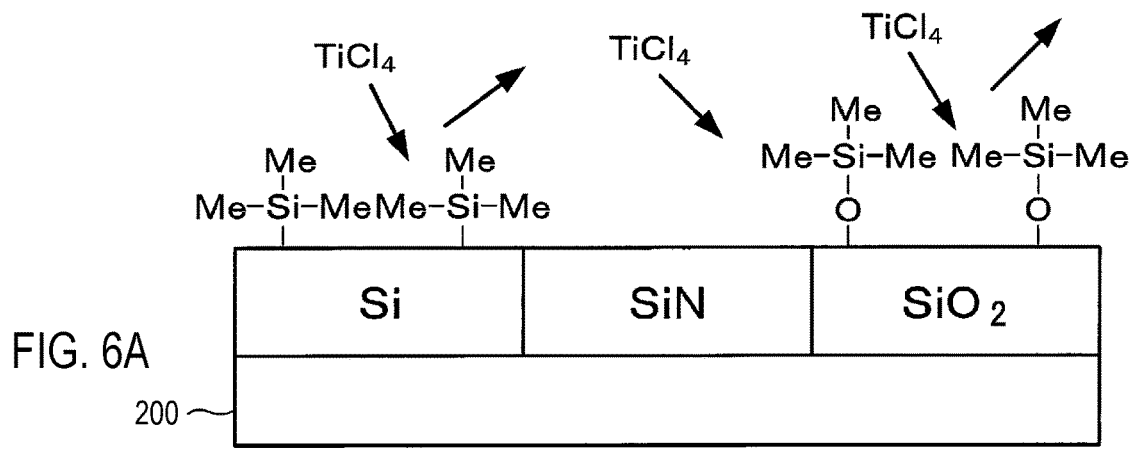
FIG. 6A is a model diagram illustrating a state of the surface of the wafer immediately after a $TiCl_4$ gas is supplied.
Figure 6B:
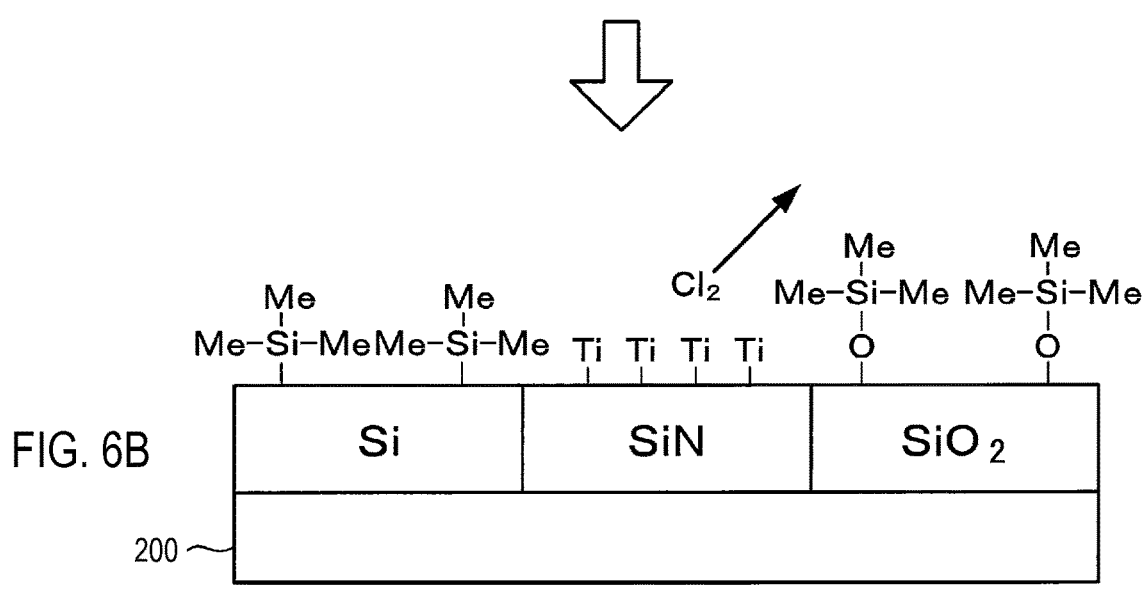
FIG. 6B is a model diagram illustrating a state of the surface of the wafer after exposure to the $TiCl_4$ gas.
Figure 6C:
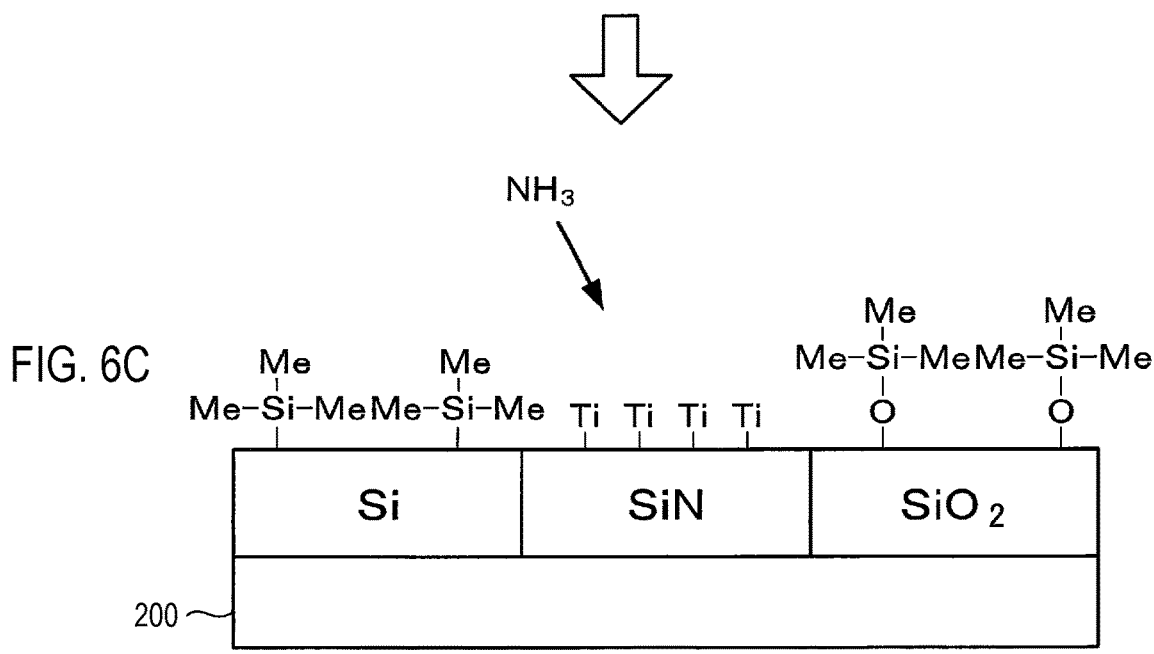
FIG. 6C is a model diagram illustrating a state of the surface of the wafer immediately after a $NH_3$ gas is supplied.
Figure 7A:
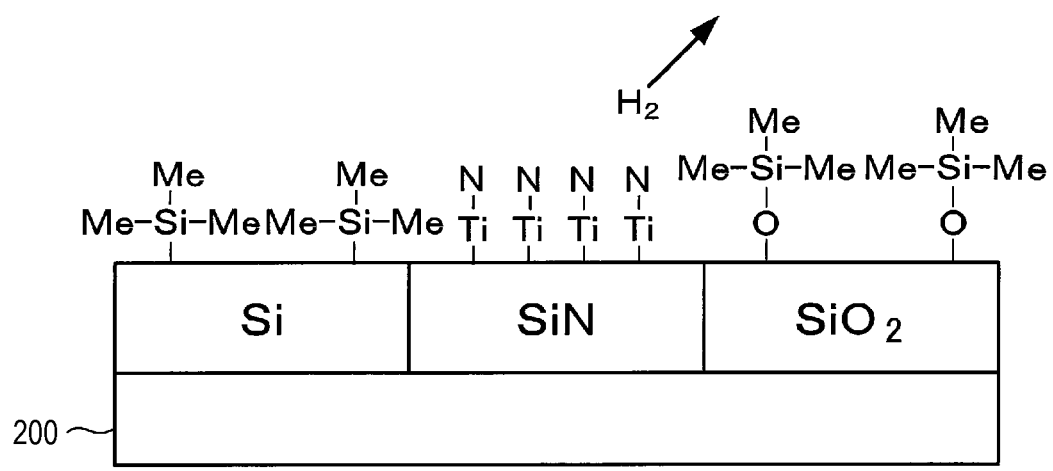
FIG. 7A is a model diagram illustrating a state of the surface of the wafer after exposure to the $NH_3$ gas.

A state in which the TiN film is formed on the SiN layer is illustrated in FIGS. 6A to 6C and 7A. FIG. 6A is a model diagram illustrating a state of the surface of the wafer immediately after a $TiCl_4$ gas is supplied, FIG. 6B is a model diagram illustrating a state of the surface of the wafer after exposure to the $TiCl_4$ gas, and FIG. 6C is a model diagram illustrating a state of the surface of the wafer immediately after a $NH_3$ gas is supplied. FIG. 7A is a model diagram illustrating a state of the surface of the wafer after exposure to the $NH_3$ gas.

Referring to FIG. 7A, it can be seen that the surfaces of the Si layer and the $SiO_2$ layer on the wafer 200 are terminated with the organic ligand (organically terminated)

on the surface of the wafer 200. Further, it can be seen that the TiN film containing Ti and N is formed on the surface of the SiN layer on the wafer 200. That is, it can be seen that the surfaces of the Si layer and the SiO$_2$ layer are organically terminated such that no TiN film is formed on the surfaces.

Performing a Predetermined Number of Times

Figure 7B:
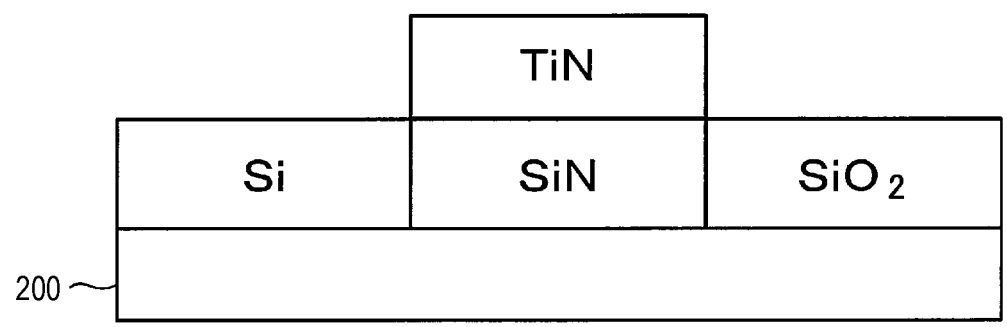
FIG. 7B is a diagram illustrating the surface of the wafer after substrate processing according to embodiments of the present disclosure is performed.

Then, a cycle which sequentially performs the first step to the fourth step described above by alternately supplying the TiCl$_4$ gas as the precursor gas and the NH$_3$ gas as the reaction gas such that they are not mixed with each other is performed once or more (a predetermined number of times (n times)), whereby a TiN film having a predetermined thickness (for example, several nanometers) may be formed on the SiN layer of the wafer 200, as illustrated in FIG. 7B. The aforementioned cycle may be performed multiple times.

Further, in the pre-processing described above, there has been described a configuration in which a pulse supply is performed by alternately performing the adsorption control agent supply step (HMDSN gas supply) and the purge step (residual gas removal) a plurality of times, but the adsorption control agent supply step (HMDSN gas supply) and the purge step (residual gas removal) may be sequentially and consecutively performed once in the process chamber 201 and then the film-forming process described above may be performed in the process chamber 201.

After-Purge and Atmospheric Pressure Return

The N$_2$ gas is supplied from each of the gas supply pipes 510, 520 and 530 into the process chamber 201 and is exhausted from the exhaust pipe 231. The N$_2$ gas acts as a purge gas. Thus, the interior of the process chamber 201 is purged with an inert gas and the gas or the byproduct, which remains within the process chamber 201, is removed from the interior of the process chamber 201 (after-purge). Thereafter, the internal atmosphere of the process chamber 201 is substituted by the inert gas (inert gas substitution). The internal pressure of the process chamber 201 is returned to an atmospheric pressure (atmospheric pressure return).

Wafer Unloading

Next, the seal cap 219 is moved down by the boat elevator 115 to open the lower end of the outer tube 203. Then, the processed wafers 200 supported on the boat 217 are unloaded from the lower end of the outer tube 203 to the outside of the outer tube 203 (boat unloading). Thereafter, the processed wafers 200 are discharged from the boat 217 (wafer discharging).

(3) Effects According to Embodiments of the Present Disclosure

In the present embodiment, the surface of the wafer 200 is first exposed to the HMDSN gas to organically terminate the surfaces of the Si layer and the SiO$_2$ layer. Thus, the precursor molecules are adsorbed only on the SiN layer which is not organically terminated. That is, the precursor molecules may not be easily adsorbed on the Si layer and the SiO$_2$ layer on which the organic ligand contained in the HMDSN gas is adsorbed, such that the TiN film may not be formed. Further, the precursor molecules are adsorbed on the SiN layer on which the organic ligand contained in the HMDSN gas is not adsorbed, thereby selectively growing the TiN film.

That is, the kind of the surface of the wafer 200 on which the organic ligand contained in the adsorption control agent is adsorbed may be set different by controlling the temperature of the wafer 200 when the wafer 200 is exposed to the adsorption control agent such that film formation may be performed according to the kind of the surface of the wafer. In other words, the kind of the surface of the wafer 200 on which the film is to be selectively grown may be controlled.

As a result, according to the present embodiment, it is possible to provide a technique capable of forming a semiconductor device in which the film is selectively formed on the wafer 200.

(4) Other Embodiments

Next, other embodiments in which films are formed according to a kind of the surface of the wafer by controlling the temperature of the wafer 200 when the wafer 200 is exposed to the adsorption control agent will be described. Hereinafter, an example in which a TiN film is selectively grown on a SiO$_2$ layer and a SiN layer on a wafer 200 including a Si layer as a first region and the SiO$_2$ layer and the SiN layer as a second region, as base films, on a surface of the wafer 200 will be described.

The substrate processing (the process of manufacturing a semiconductor device) according to the embodiments includes: a step of organically terminating a surface of a Si layer by supplying a HMDSN gas as an adsorption control agent containing an organic ligand to a wafer 200 while regulating a temperature of the wafer 200 including the Si layer, a SiN layer, and a SiO$_2$ layer on a surface of the wafer 200 depending on a composition of the Si layer; and a step of selectively growing a TiN film on the SiO$_2$ layer and the SiN layer by supplying a TiCl$_4$ gas as a precursor gas and a NH$_3$ gas as a reaction gas, as deposition gases, to the wafer 200.

Figure 8A:
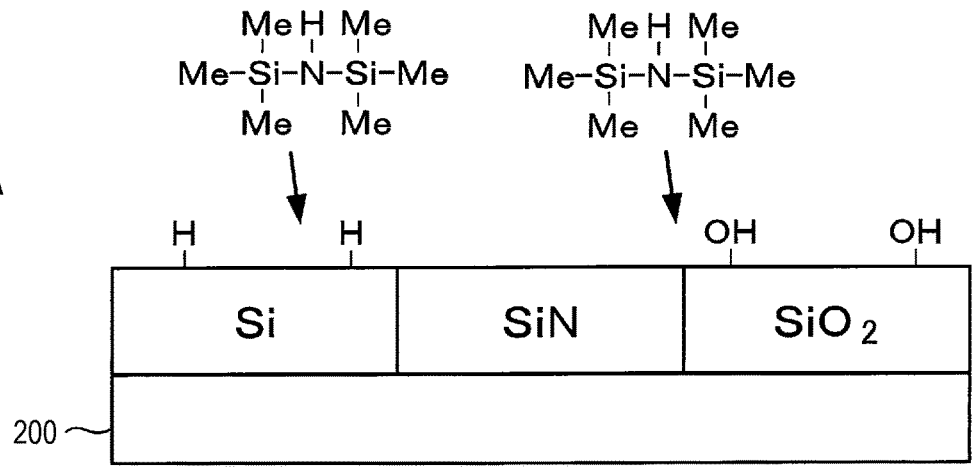
FIG. 8A is a model diagram illustrating a state immediately after the surface of the wafer is exposed to the HMDSN gas.
Figure 8B:
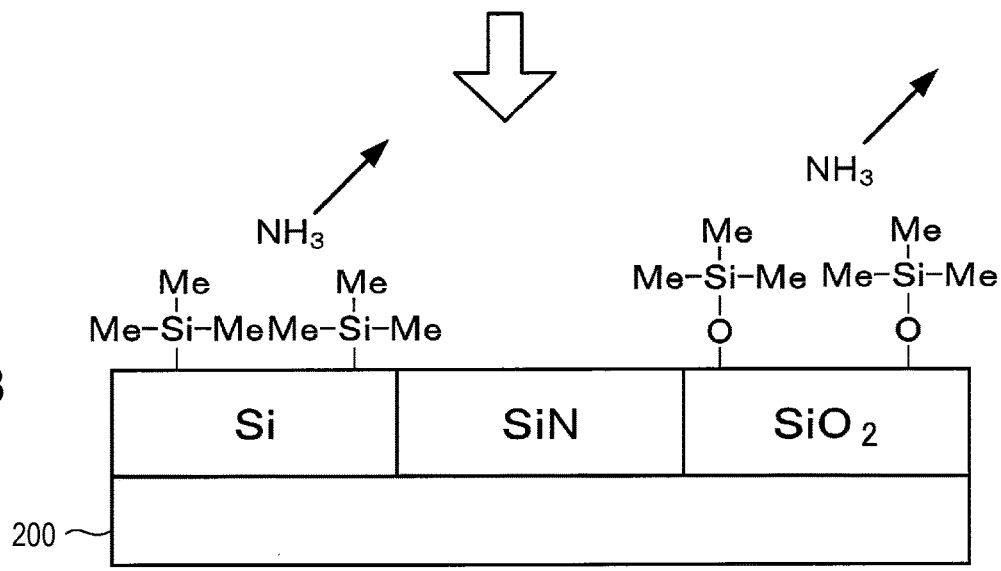
FIG. 8B is a model diagram illustrating a state of the surface of the wafer after exposure to the HMDSN gas.
Figure 8C:
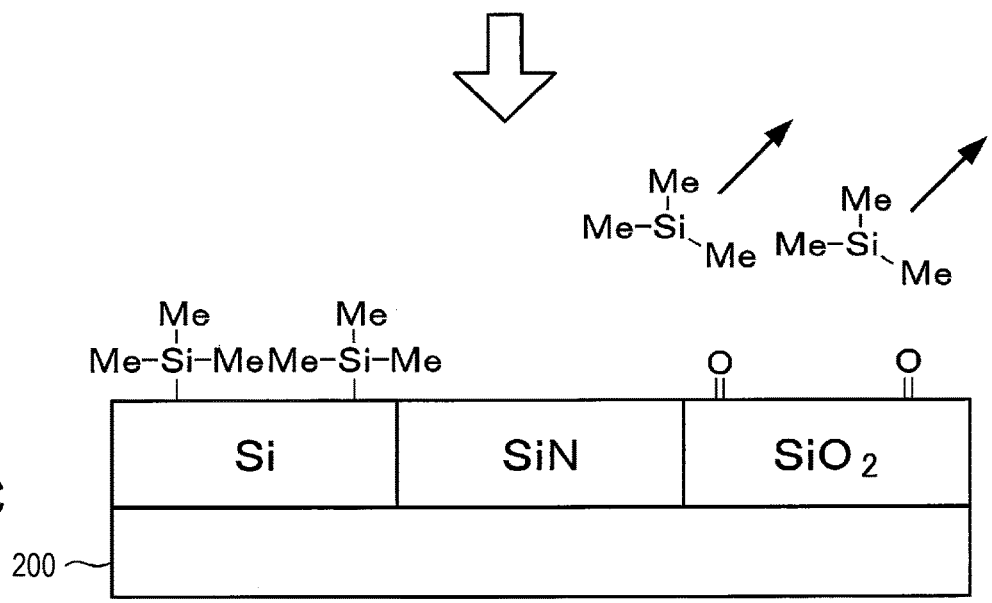
FIG. 8C is a model diagram illustrating a state after the state of the surface of the wafer after the exposure to the HMDSN gas in FIG. 8B.

A state in which the surface of the Si layer is organically terminated is illustrated in FIGS. 8A to 8C. FIG. 8A is a model diagram illustrating a state immediately after the surface of the wafer 200 on which the Si layer, the SiN layer, and the SiO$_2$ layer are formed is exposed to the HMDSN gas, FIG. 8B is a model diagram illustrating a state of the surface of the wafer 200 after exposure to the HMDSN gas, and FIG. 8C is a model diagram illustrating a state after the state of the surface of the wafer 200 after the exposure to the HMDSN gas in FIG. 8B.

Referring to FIGS. 8A and 8B, on the surface of the wafer 200 after exposure to the HMDSN gas, H molecules on the Si layer and the SiO$_2$ layer adsorbed on the surface with the HMDSN gas are bonded to N molecules of the HMDSN gas to generate NH$_3$ to be desorbed. Further, Si(Me)$_3$ containing a methyl group as an organic ligand is adsorbed on a place from which the H molecules are desorbed, to organically terminate the surfaces of the Si layer and the SiO$_2$ layer. However, at a temperature which falls within a range of 300 to 500 degree C., Si(Me)$_3$ adsorbed on the SiO$_2$ layer may be separated and desorbed from a surface of the SiO$_2$ layer, as illustrated in FIG. 8C. Alternatively, the organic ligand contained in the HMDSN gas is not adsorbed on the SiN layer and the SiO$_2$ layer from the beginning. Thus, the precursor molecules are adsorbed only on the SiO$_2$ layer and the SiN layer which are not organically terminated. That is, the precursor molecules may not be easily adsorbed on the Si layer on which the organic ligand contained in the HMDSN gas is adsorbed, such that the TiN film may not be formed. Further, the precursor molecules may be adsorbed on the SiO$_2$ layer and the SiN layer on which the organic ligand contained in the HMDSN gas is not adsorbed, thereby selectively growing the TiN film.

That is, the temperature of the wafer 200 when the wafer 200 is exposed to the HMDSN gas in the embodiments may be a temperature which falls within a range of, for example, 300 to 500 degrees C., specifically 300 to 400 degrees C. in some embodiments, or specifically 330 to 350 degrees C. in some embodiments, as a temperature at which the organic ligand contained in the HMDSN gas is adsorbed only on the Si layer but not adsorbed on the $SiO_2$ layer and the SiN layer such that only the surface of the Si layer is organically terminated. At a temperature lower than 300 degrees C., the organic ligand (the methyl group or the like) contained in the HMDSN gas may remain adsorbed even on the $SiO_2$ layer, making it difficult to adsorb the precursor molecules to the $SiO_2$ layer. At a temperature higher than 500 degrees C., the organic ligand contained in the HMDSN gas may not be adsorbed not only on the $SiO_2$ layer but also on the Si layer, or may be separated and desorbed from the surfaces of the layers even when the organic ligand is adsorbed on the layers.

That is, a substrate selectivity of the adsorption control agent for adsorption may be changed by changing the temperature of the wafer when the wafer is exposed to the adsorption control agent, thereby changing a film formation selectivity. For example, by using the HMDSN gas as the adsorption control agent, a film can be formed only on the SiN layer among the Si layer, the $SiO_2$ layer and the SiN layer at a lower wafer temperature (100 to 250 degrees C.) at which the methyl group contained in the HMDSN gas is adsorbed on the Si layer and the $SiO_2$ layer but not adsorbed on the SiN layer, and the film can be formed on the $SiO_2$ layer and the SiN layer among the Si layer, the $SiO_2$ layer and the SiN layer at a higher wafer temperature (300 to 500 degrees C.) at which the methyl group contained in the HMDSN gas is adsorbed only on Si layer but not adsorbed on the $SiO_2$ layer and the SiN layer.

That is, a specific kind of the surface of the wafer 200 is organically terminated by exposing the surface of the wafer 200 to the adsorption control agent as the pre-processing. Thus, the precursor molecules are adsorbed only on a specific kind of the surface of the wafer 200 which is not organically terminated. The precursor molecules may not be easily adsorbed on a specific kind of the surface of the wafer 200 on which the adsorption control agent is adsorbed, such that a film may not be formed on the specific kind of the surface of the wafer 200 on which the adsorption control agent is adsorbed. Further, the precursor molecules may be adsorbed on a specific kind of the surface of the wafer 200 on which the adsorption control agent is not adsorbed, enabling the selective growth on the specific kind of the surface of the wafer 200 on which the adsorption control agent is not adsorbed.

Further, in the aforementioned embodiments, there have been described cases where the methyl group contained in the HMDSN gas is used as the adsorption control agent, but the present disclosure is not limited to the aforementioned embodiments. A gas containing alkylamine in the ligand may be used as the adsorption control agent, a methyl group containing a ligand smaller than that of other ethyl groups or the like is more effective when it is desired to densely spread the alkylamine, and ethyl groups or the like having a large ligand is less volatile and thus more effective when high heat resistance is desired. In addition, as the adsorption control agent, a gas containing molecules having characteristics that the probability of adsorption on the surface of the wafer 200 depends on the kind of the wafer such as the Si layer, the $SiO_2$ layer, and the SiN layer may be used.

That is, the substrate selectivity of the adsorption control agent for adsorption may be changed by changing the ligand having the substrate selectivity of the adsorption control agent, thereby changing the selectivity of film formation. For example, the adsorption control agent can be selectively adsorbed on the $SiO_2$ layer and the Si layer by using dialkylamine as the ligand having the substrate selectivity of the adsorption control agent, such that a film may not be formed on the $SiO_2$ layer and the Si layer.

Similarly, in the aforementioned embodiments, there have been described the cases where the TiN film is selectively grown with the deposition gas, but the present disclosure is not limited to the aforementioned embodiments. The present disclosure may also be applied to a case where a kind of film to be formed at a low temperature, for example, an ultra-low temperature SiO film, is selectively grown.

In addition, in the aforementioned embodiments, there have been described the cases where the pre-processing as the organic termination step and the film-forming process as the selective growth step are performed in one process chamber 201, but the present disclosure is not limited to the aforementioned embodiments. For example, the present disclosure may be similarly applied to a case where each step is performed in a different process chamber by using a cluster-type apparatus including a plurality of process chambers. In this case, a transfer system and a control part may be shared. Further, the present disclosure may be similarly applied to a case where each step is performed by a different substrate processing apparatus by using a substrate processing system including a plurality of substrate processing apparatuses.

Further, in the aforementioned embodiments, there have been described the cases where films are formed by using a batch-type process furnace capable of processing a plurality of wafers at a time, but the present disclosure is not limited to the aforementioned embodiments. For example, the present disclosure may be similarly applied to, for example, a case where films are formed by using a single-wafer-type process furnace capable of processing a single wafer or several wafers at a time. Further, the present disclosure may be similarly applied to, for example, a case where all the process chambers included in each of the cluster-type apparatus and the substrate processing system described above may be batch-type process furnaces, single-wafer-type process furnaces, or a combination thereof.

Although various exemplary embodiments of the present disclosure have been described above, the present disclosure is not limited to the embodiments but may be used in combination as appropriate.

(5) Examples

Figure 9A:
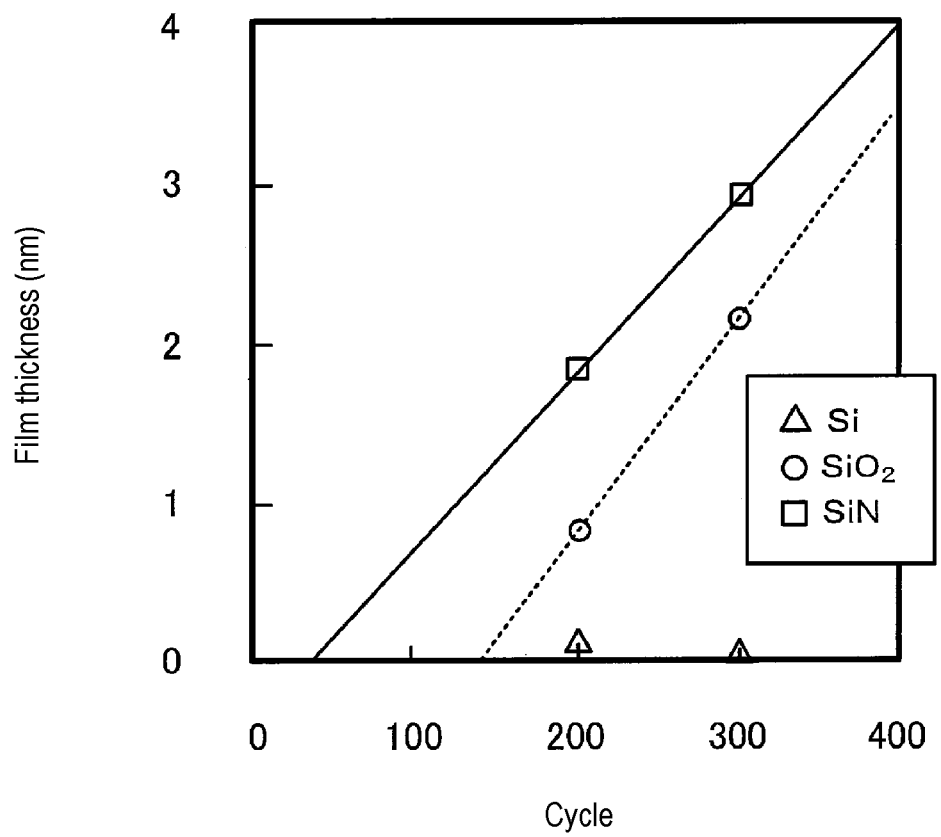
FIG. 9A is a diagram illustrating a relationship between the number of film formation cycles of the TiN film formed on each of the Si layer, the SiN layer, and the $SiO_2$ layer at a processing temperature of 200 degrees C. and a film thickness.
Figure 9B:
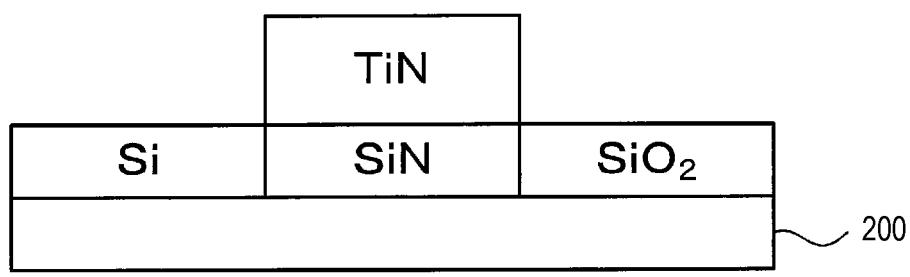
FIG. 9B is a model diagram illustrating a state of the surface of the wafer after 100 cycles of the TiN film formed on each of the Si layer, the SiN layer, and the $SiO_2$ layer at the processing temperature of 200 degrees C.

Next, a difference in film thickness of a TiN film formed depending on a temperature of a wafer when the TiN film is formed on the wafer on which a Si layer, a $SiO_2$ layer, and a SiN layer are formed as base films by using the substrate processing apparatus 10 described above and the substrate processing described with reference to FIG. 4 will be described with reference to FIGS. 9A, 9B, 10A and 10B. FIGS. 9A and 9B show results of selective film formation of a TiN film at a wafer temperature of 200 degrees C., and FIGS. 10A and 10B show results of selective film formation of the TiN film at a wafer temperature of 350 degrees C.

As shown in FIG. 9A, it was confirmed that the TiN film is formed on the SiN layer according to the number of cycles immediately after the start of the film-forming process described above at the wafer temperature of 200 degrees C. On the other hand, it was confirmed that the TiN film as shown in FIG. 9B is not formed on the SiO$_2$ layer and the Si layer unless the film-forming process described above is performed 100 cycles or more. This is considered to be because, at the wafer temperature of 200 degrees C., the surface of the SiO$_2$ layer and the surface of the Si layer are organically terminated and the surface of the SiN layer is not organically terminated up to less than 100 cycles. That is, the TiN film can be selectively formed on the SiN layer when the film-forming process is stopped before the film formation begins on the surface of the SiO$_2$ layer and the surface of the Si layer (before the desorption or decomposition of the adsorption control agent on the surface of the SiO$_2$ layer and the surface of the Si layer occurs).

Figure 10A:
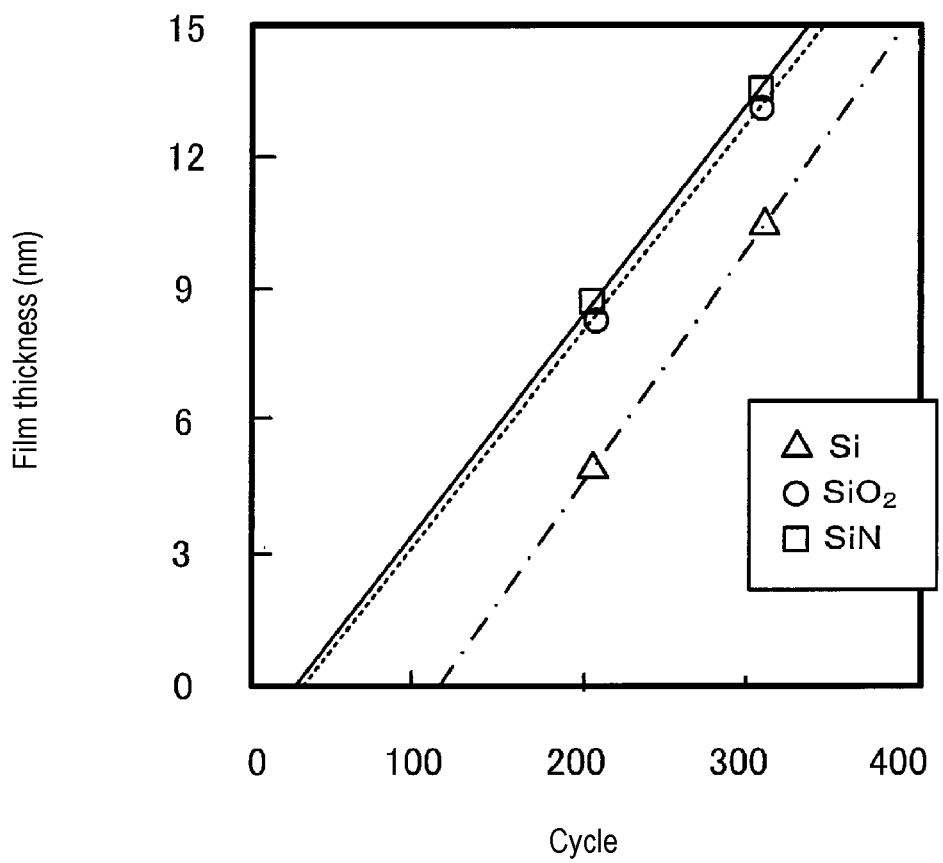
FIG. 10A is a diagram illustrating a relationship between the number of film formation cycles of the TiN film formed on each of the Si layer, the SiN layer, and the $SiO_2$ layer at a processing temperature of 350 degrees C. and a film thickness.
Figure 10B:
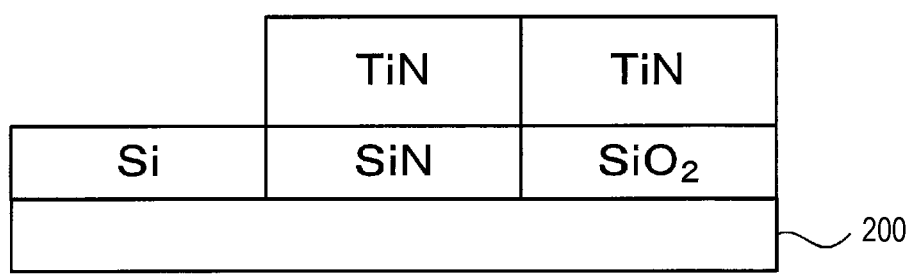
FIG. 10B is a model diagram illustrating a state of the surface of the wafer after 100 cycles of the TiN film formed on each of the Si layer, the SiN layer, and the $SiO_2$ layer at the processing temperature of 350 degrees C.

Furthermore, as shown in FIG. 10A, it was confirmed that a TiN film is formed on the SiN layer and the SiO$_2$ layer according to the number of cycles immediately after the start of the film-forming process described above at the wafer temperature of 350 degrees C. On the other hand, it was confirmed that the TiN film as shown in FIG. 10B is not formed on the Si layer unless the film-forming process described above is performed more than 100 cycles. This is considered to be because, at the wafer temperature of 350 degrees C., the surface of the Si layer is organically terminated up to about 100 cycles. That is, the TiN film can be selectively formed on the SiN layer and on the SiO$_2$ layer when the film-forming process is stopped before the film formation begins on the surface of the Si layer (before the desorption or decomposition of the adsorption control agent on the surface of the Si layer occurs).

From the aforementioned results, it can be seen that the selectivity may be changed depending on the film-forming temperature by supplying the adsorption control agent before supplying the deposition gas to perform the organic termination on the surface of the base film.

According to the present disclosure in some embodiments, it is possible to selectively form a film on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
organically terminating a first region of a substrate that includes the first region including a silicon layer and a second region including a silicon oxide layer and a silicon nitride layer, which are formed on a surface of the substrate, by supplying an adsorption control agent containing an organic ligand to the substrate while regulating a temperature of the substrate to 300 degrees C. or higher and 500 degrees C. or lower; and
selectively growing a film on the second region by supplying a deposition gas to the substrate.

2. The substrate processing method according to claim 1, wherein the organic ligand contains an alkyl group.

3. The substrate processing method according to claim 2, wherein a ligand contained in the deposition gas and the organic ligand are respectively selected from electrically negative ligands.

4. The substrate processing method according to claim 1, wherein the organic ligand is alkylamine.

5. The substrate processing method according to claim 4, wherein a ligand contained in the deposition gas and the organic ligand are respectively selected from electrically negative ligands.

6. The substrate processing method according to claim 1, wherein a ligand contained in the deposition gas and the organic ligand are respectively selected from electrically negative ligands.

7. A method of manufacturing a semiconductor device, comprising the substrate processing method according to claim 1.

8. A non-transitory computer-readable recording medium storing a program that causes, by a computer, a substrate processing apparatus to perform a process comprising:
organically terminating a first region of a substrate that includes the first region including a silicon layer and a second region including a silicon oxide layer and a silicon nitride layer, which are formed on a surface of the substrate, by supplying an adsorption control agent containing an organic ligand to the substrate while regulating a temperature of the substrate to 300 degrees C. or higher and 500 degrees C. or lower; and
selectively growing a film on the second region by supplying a deposition gas to the substrate.

* * * * *